United States Patent
Festa et al.

(10) Patent No.: US 12,356,597 B2
(45) Date of Patent: Jul. 8, 2025

(54) ELECTRIC CONDUCTOR ASSEMBLY

(71) Applicant: Innomotics GmbH, Nuremberg (DE)

(72) Inventors: Marco Festa, Falkensee (DE); Moritz Greinacher, Berlin (DE)

(73) Assignee: Innomotics GmbH, Nuremberg (DE)

( * ) Notice: Subject to any disclaimer, the term of this patent is extended or adjusted under 35 U.S.C. 154(b) by 673 days.

(21) Appl. No.: 17/764,071

(22) PCT Filed: Jul. 15, 2020

(86) PCT No.: PCT/EP2020/069943
§ 371 (c)(1),
(2) Date: Mar. 25, 2022

(87) PCT Pub. No.: WO2021/058160
PCT Pub. Date: Apr. 1, 2021

(65) Prior Publication Data
US 2022/0361383 A1   Nov. 10, 2022

(30) Foreign Application Priority Data

Sep. 27, 2019   (EP) .................................. 19200091

(51) Int. Cl.
*H01B 13/26*   (2006.01)
*H01B 1/20*   (2006.01)
(Continued)

(52) U.S. Cl.
CPC .............. *H05K 9/009* (2013.01); *H01B 1/20* (2013.01); *H01B 7/0009* (2013.01); *H01B 7/02* (2013.01);
(Continued)

(58) Field of Classification Search
CPC ...... H05K 9/009; H05K 9/0098; H05K 13/00; H01B 1/20; H01B 7/0009; H01B 7/02;
(Continued)

(56) References Cited

U.S. PATENT DOCUMENTS

| | | | | |
|---|---|---|---|---|
| 5,486,648 A | * | 1/1996 | Chan | ...... H01B 7/288 174/106 SC |
| 6,333,462 B1 | * | 12/2001 | Quaggia | ...... H02G 15/06 174/73.1 |

(Continued)

FOREIGN PATENT DOCUMENTS

| CN | 1663094 A | 8/2005 |
|---|---|---|
| CN | 1864309 A | 11/2006 |

(Continued)

OTHER PUBLICATIONS

PCT International Examination Report and Written Opinion of International Examination Authority mailed Oct. 29, 2020 corresponding to PCT International Application No. PCT/EP2020/069943 filed Jul. 15, 2020.

*Primary Examiner* — Angel R Estrada
(74) *Attorney, Agent, or Firm* — Henry M. Feiereisen LLC

(57) ABSTRACT

An electrical conductor assembly includes an electrical conductor, an electrically insulating jacket disposed around a conductor section of the electrical conductor, an electrically conductive sleeve disposed around a first insulating jacket section of the insulating jacket, and an electrically conductive yarn for realizing an electric field control. The electrically conductive yarn is wound around a second insulating jacket section of the electrically insulating jacket in adjacent relation to the first insulating jacket section.

21 Claims, 3 Drawing Sheets

(51) Int. Cl.
  *H01B 7/00* (2006.01)
  *H01B 7/02* (2006.01)
  *H01B 13/22* (2006.01)
  *H01B 17/58* (2006.01)
  *H05K 9/00* (2006.01)
  *H01B 17/60* (2006.01)

(52) U.S. Cl.
  CPC ............. *H01B 13/22* (2013.01); *H01B 13/26* (2013.01); *H01B 17/58* (2013.01); *H05K 9/0098* (2013.01); *H01B 17/60* (2013.01)

(58) Field of Classification Search
  CPC ........ H01B 13/22; H01B 13/26; H01B 17/58; H01B 17/60; H02G 15/068; H02G 15/184; H02G 15/103; H02G 15/22
  USPC .......... 174/650, 68.1, 73.1, 102 R, 107, 108, 174/110 R
  See application file for complete search history.

(56) References Cited

U.S. PATENT DOCUMENTS

| | | | |
|---|---|---|---|
| 6,426,150 B1 * | 7/2002 | Jenkner | H01B 19/04 528/42 |
| 6,810,847 B1 * | 11/2004 | Jefferson | H01R 13/6485 123/169 P |
| 7,402,753 B2 * | 7/2008 | Varkey | H01B 7/046 174/102 R |
| 8,413,723 B2 * | 4/2013 | Varkey | E21B 47/125 166/385 |
| 9,773,585 B1 * | 9/2017 | Rogers | H01B 7/295 |
| 10,476,251 B2 * | 11/2019 | Heidmann | H02G 15/068 |
| 2005/0194551 A1 | 9/2005 | Klaussner | |
| 2007/0000680 A1 | 1/2007 | Adachi et al. | |
| 2010/0288527 A1 | 11/2010 | Lichy | |
| 2015/0122546 A1 | 5/2015 | Saugrain et al. | |
| 2018/0062370 A1 | 3/2018 | Heidmann et al. | |

FOREIGN PATENT DOCUMENTS

| | | |
|---|---|---|
| CN | 101461110 A | 6/2009 |
| CN | 104350655 A | 2/2015 |
| CN | 109802351 A | 5/2019 |
| DE | 1777892 U | 11/1958 |
| DE | 7722352 U1 | 10/1977 |
| DE | 3312025 A1 | 10/1984 |
| EP | 0445490 A1 | 9/1991 |
| EP | 1056162 A2 | 11/2000 |
| EP | 1147445 A1 | 10/2001 |
| EP | 1995850 A1 | 11/2008 |
| JP | H10243540 A | 9/1998 |
| RU | 2681207 C1 | 3/2019 |

* cited by examiner

ELECTRIC CONDUCTOR ASSEMBLY

CROSS-REFERENCES TO RELATED APPLICATIONS

This application Is the U.S. National Stage of International Application No. PCT/EP2020/069943, filed Jul. 15, 2020, which designated the United States and has been published as International Publication No. WO 2021/058160 A1 and which claims the priority of European Patent Application, Serial No. 19200091.7, filed Sep. 27, 2019, pursuant to 35 U.S.C. 119(a)-(d).

BACKGROUND OF THE INVENTION

The invention relates to an electrical conductor assembly comprising an electrical conductor, an electrically insulating jacket disposed around at least one section of the conductor, and an electrically conductive sleeve disposed around a section of the insulating jacket.

Such conductor assemblies are used in and/or on many items of electrical equipment, e.g. in electrical bushings inserted through enclosure openings, or on cables, wherein the electrically conductive sleeve of a conductor assembly is used, for example, to shield against electric fields. A particular weak point of such a conductor assembly is the region where the sleeve around the insulating jacket ends. In this area, high electric field intensities at the end of the sleeve acting as an electrode can cause significant discharges ("sparking") to occur on the surface of the insulating jacket, which can damage or destroy the insulating jacket in a short time. This effect is further exacerbated if the end of the sleeve is sharp-edged, because small radii of an edge of the sleeve result in particularly high electric field intensities in the area around the edge.

Measures to control the local electric field intensities are referred to as field control. Elements for field control are called field control elements. Different measures are taken depending on the field control requirements. For example, it may be sufficient to make the radii of an electrode large enough to keep the field intensity at the interface below the electrical strength of the insulating jacket. This type of field control is called geometric field control.

Alternatively, weakly conductive coatings in the form of paints, tape, or filled plastics can be applied to the surface of the insulating jacket as field control elements. The electric field drives a current through these materials, which, together with their resistance, results in a voltage drop. This voltage drop in turn defines the potential along the surface. The more precisely the resistance can be adjusted, the more precisely the potential and thus the field can be controlled. This type of field control is called resistive field control. However, along such a system, the field intensity is not constant in the case of AC voltage because some of the current flows capacitively via the insulating jacket to the conductor of the conductor assembly. As a result, the voltage drop is lower farther away from the sleeve. This can be counteracted by lowering the resistance over the length of the field control element.

Another possibility is to use materials whose conductivity exhibits a strong dependence on the field intensity present. At points particularly exposed to field intensity, such materials become more conductive, further reducing the field intensity. This type of field control is called nonlinear field control.

Alternatively, so-called refractive materials, which have a high relative permittivity, can be used for AC voltage systems. These materials "refract" the electric field at their interface with the insulation, thus forcing it away from the electrode edge. This type of field control is called refractive field control.

A termination of a plastic-insulated power cable is known from DE 77 22 352 U1. A field control funnel is disclosed, having a jacket in which a continuous conducting wire is embedded.

The object of the invention is to provide an electrical conductor assembly of the type described above, having field control that can be implemented simply, precisely and adaptably to the respective requirements, in particular for electrical bushings and cables.

SUMMARY OF THE INVENTION

The object is achieved according to the invention by an electrical conductor assembly as set forth hereinafter, by a method for producing an electrical conductor assembly as set forth hereinafter, by an electrical bushing as set forth hereinafter, and by a cable as set forth hereinafter.

Advantageous embodiments of the invention are set forth in the sub-claims.

An electrical conductor assembly according to the invention comprises an electrical conductor, an electrically insulating jacket disposed around at least one section of the conductor, an electrically conductive sleeve disposed around a first section of the insulating jacket, and an electrically conductive yarn wound around a second section of the insulating jacket adjacent to the first insulating jacket section for electrical field control. In particular, a winding apparatus is used for winding. For winding, a rotational movement is performed. For example, the conductor assembly with the insulating jacket is rotated. It is also possible, for example, for the conductor assembly with the insulating jacket to be fixed during winding and for the yarn to be wound around the conductor assembly onto the insulating jacket by means of a rotating device. The yarn (the electrically conductive yarn) can be wound directly onto the insulating jacket. Thus, the yarn (the electrically conductive yarn) has been or is wound directly onto the insulating jacket.

An electrical conductor assembly according to the invention therefore comprises an electrically conductive yarn for field control. The yarn is wound around a section of an insulating jacket having an insulating jacket section adjacent thereto between a conductor and an electrically conductive sleeve of the conductor assembly. The yarn is used here as a field control element for an electric field at the end of the electrically conductive sleeve. The selection of the material from which the yarn is made and the design of the winding of the yarn advantageously makes it possible to implement precise field control which can be variably adapted to the respective requirements and which requires minimal installation space and can therefore be advantageously used particularly where space is at a premium.

In one embodiment of the invention, an end section of the yarn is bonded, e.g. adhesively, to an end section of the sleeve. The advantage of this is that an end section of the yarn is fixed in the vicinity of the end section of the sleeve and the yarn is electrically coupled to the sleeve galvanically and/or capacitively.

In another embodiment of the invention, the yarn is helically wound around the second insulating jacket section. In particular, the helical winding of the yarn can have different pitches. As a result, the pitch of the helical winding and its variation along the course of the winding can flexibly adjust the electrical resistance of the winding, and its local variation in a direction parallel to the conductor, according to the respective field control requirements.

In another embodiment of the invention, the yarn has a lower specific electrical conductivity than the sleeve. In another embodiment of the invention, the wound yarn has an electrical resistance ranging between 1 MΩ/m and 100 MΩ/m. These embodiments of the invention are matched to typical designs of electrically conductive sleeves.

In another embodiment of the invention, the yarn is made of a polyamide fiber sheathed with an electrically conductive carbon-containing material, or of a fiber blend comprising at least a polyamide fiber and an electrically conductive carbon fiber, or of a metallic fiber. The aforementioned materials enable electrically weakly conductive wound yarn to be produced and are therefore particularly suitable for manufacturing yarn for a conductor assembly according to the invention.

In another embodiment of the invention, the yarn is surrounded by a protective layer or wrapper. This enables the yarn to be advantageously protected against mechanical and/or chemical damage. Moreover, a suitable choice of material and/or a suitable composition of the protective layer or wrapper can increase the dielectric strength of the system comprising the yarn and the protective layer or wrapper.

In one embodiment of the invention, the yarn is fixed to the second insulating jacket section by a curing or curable resin. This enables the yarn to be advantageously stabilized and protected against local and global mechanical displacements. In particular, in the case of a helical winding of the yarn, the local pitches of the winding can be fixed.

Accordingly, in the method according to the invention for manufacturing a conductor assembly according to the invention, a curing or curable resin is applied to the second insulating jacket section for fixing the yarn to the second insulating jacket section and the yarn is wound around the second insulating jacket section on the resin before the resin is completely cured.

An inventive electrical bushing through an opening in an electrical equipment enclosure has a conductor assembly according to the invention, the sleeve of which is electrically connected to the enclosure and is fed through the enclosure opening with the conductor and the insulating jacket.

A cable according to the invention has a conductor assembly according to the invention.

Since an electrical bushing according to the invention and a cable according to the invention have a conductor assembly according to the invention, their advantages flow from the above-mentioned advantages of a conductor assembly according to the invention.

BRIEF DESCRIPTION OF THE DRAWING

The above-described features, characteristics and advantages of the present invention, as well as the manner in which they are achieved, will become clearer and more readily comprehensible in connection with the following description of exemplary embodiments which will be explained in more detail with reference to the accompanying drawings in which.

DETAILED DESCRIPTION OF PREFERRED EMBODIMENTS

Figure 1:
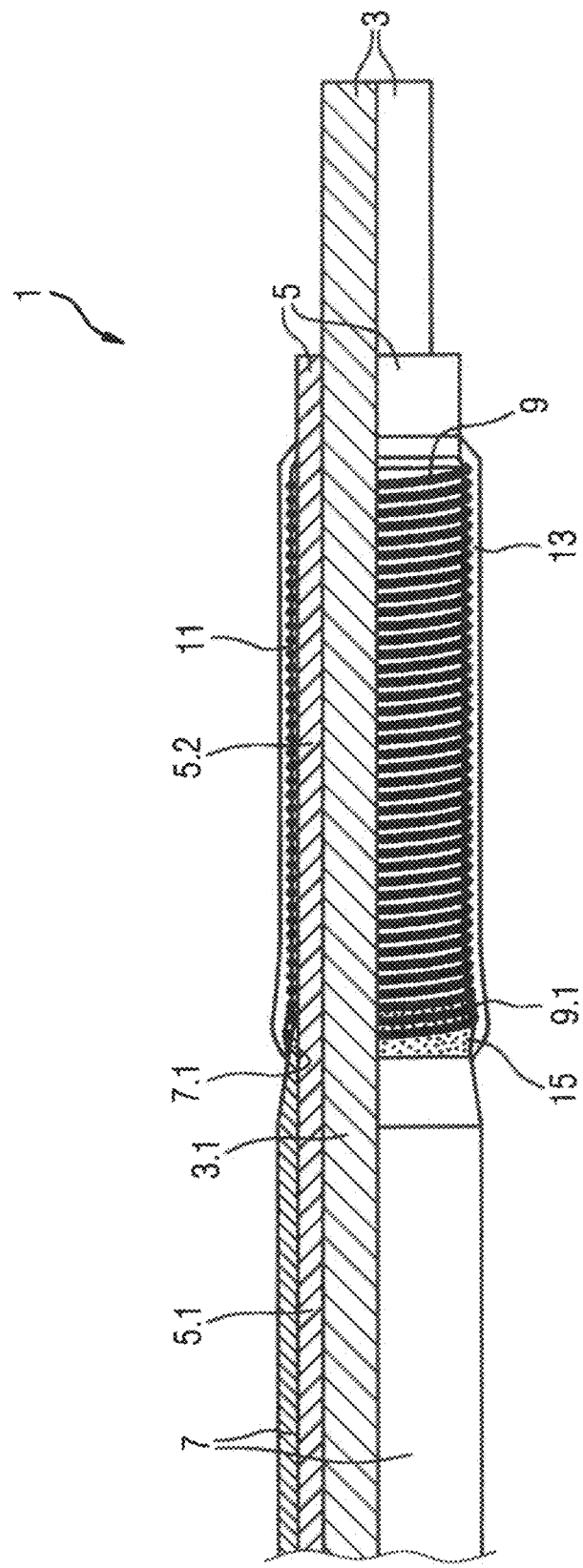
FIG. 1 shows a partially sectional view of an exemplary embodiment of an electrical conductor assembly.

Mutually corresponding parts are provided with the same reference characters in the figures.

FIG. 1 shows an exemplary embodiment of an electrical conductor assembly 1 according to the invention in a partially sectional view, wherein the upper part of FIG. 1 is a sectional view of the conductor assembly 1. The conductor assembly 1 comprises an electrical conductor 3, an electrically insulating jacket 5, an electrically conductive sleeve 7, an electrically conductive yarn 9 for electrical field control, a resin layer 11 and a protective layer 13.

The insulating jacket 5 is disposed around a conductor section 3.1 of the conductor 3. The sleeve 7 is disposed around a first insulating jacket section 5.1 of the insulating jacket 5. The resin layer 11 is applied to an outer surface of a second insulating jacket section 5.2 of the insulating jacket 5 adjacent to the first insulating jacket section 5.1. The yarn 9 is helically wound around the second insulating jacket section 5.2 on the resin layer 11. The resin layer 11 fixes the yarn 9 to the second insulating jacket section 5.2. A yarn end section 9.1 of the yarn 9 is electrically connected conductively to a jacket end section 7.1 of the jacket 7 and is cohesively fixed to the jacket end section 7.1 by an adhesive 15. The jacket end section 7.1 has an outer diameter which decreases conically toward the second insulating jacket section 5.2. The protective layer 13 is disposed around the yarn 9 and the resin layer 11. The protective layer 13 is shown as transparent, but may also be made opaque.

The conductor 3 is made of copper, for example. The insulating jacket 5 is made e.g. of polyetheretherketone (PEEK), cross-linked polyethylene (XLPE), polyvinylchloride (PVC) or a comparable polymer, oil-paper, ceramic, silicone, resin-impregnated mica tape, or synthetic resin. The sleeve 7 is made e.g. of a stainless steel. The yarn 9 is made e.g. of a polyamide fiber sheathed with an electrically conductive carbon-containing material, a fiber blend comprising at least one polyamide fiber and an electrically conductive carbon fiber, or a this metallic fiber. The resin layer 11 is made of a curing or curable resin, e.g. epoxy resin. The protective layer 13 is also made of a curing or curable resin, e.g. in particular the same resin as the resin layer 11.

The yarn 9 has a lower specific electrical conductivity than the sleeve 7. For example, the wound yarn 9 has an electrical resistance in the range between 1 MΩ/m and 100 MΩ/m.

For manufacturing the conductor assembly 1, a base body comprising the conductor 3, the insulating jacket 5 and the sleeve 7 is first produced. Resin for the resin layer 11 is then applied to the second insulating jacket section 5.2. Thereafter, the yarn 9 is wound around the jacket end section 7.1 and around the second insulating jacket section 5.2 while being pressed against the resin and bonded to the jacket end section 7.1 by the adhesive 15. Finally, material for the protective layer 13 is applied to the yarn 9 and the resin layer 11.

Figure 2:
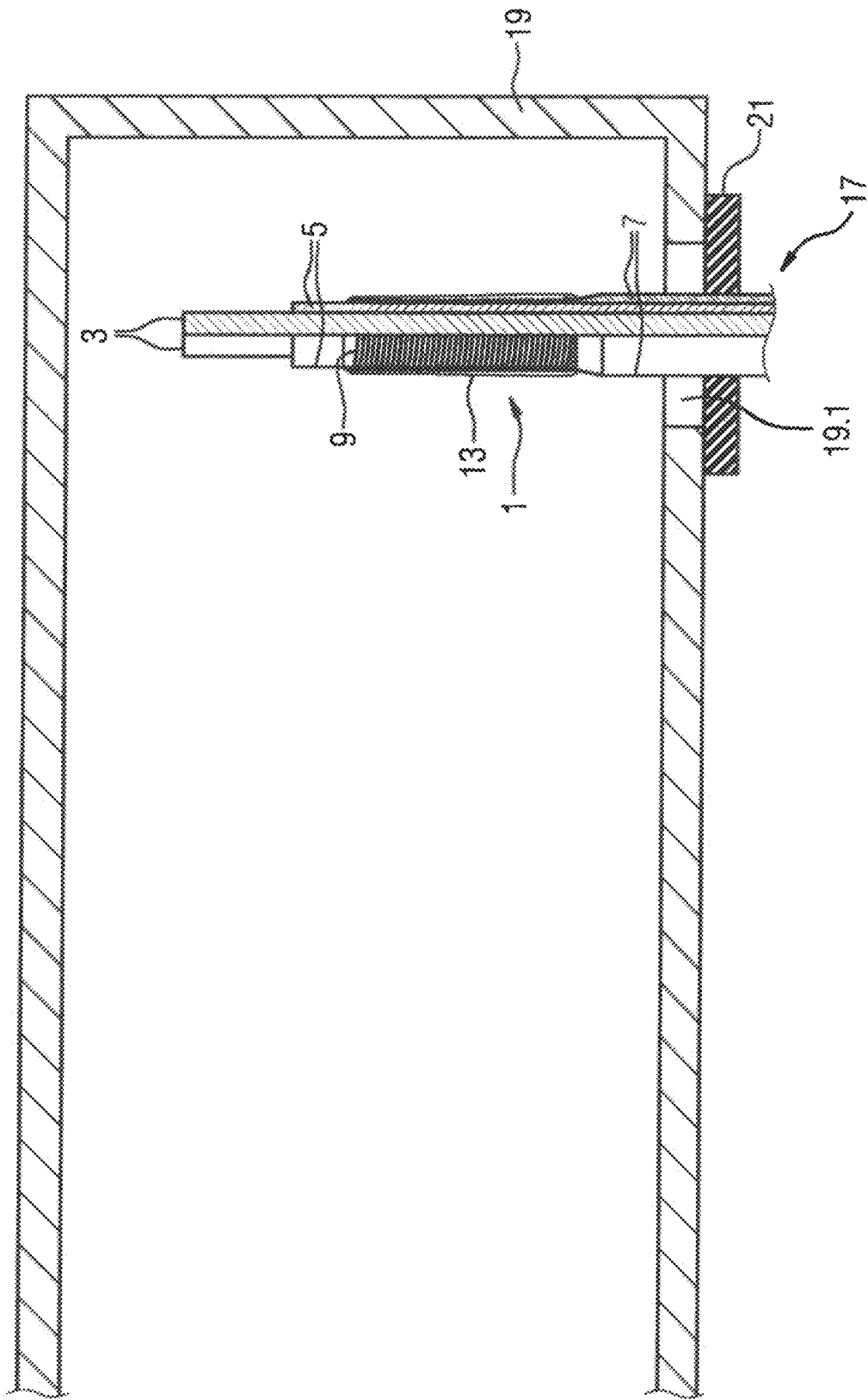
FIG. 2 shows a partially sectional view of an exemplary embodiment of an electrical bushing, FIG. 3 a partially sectional view of an exemplary embodiment of a cable.

FIG. 2 shows a partially sectional view of an exemplary embodiment of an inventive electrical bushing 17 through an enclosure opening 19.1 of an electrically conductive enclosure 19 of an item of electrical equipment. The electrical equipment is, for example, an electrical machine such as a motor, a generator or a transformer, or an electrical switching device such as a circuit breaker or disconnector. The bushing 17 incorporates a conductor assembly 1 as illustrated in FIG. 1 and a seal 21. The enclosure 19 and the seal 21 are shown in a sectional view, and the conductor assembly 1 is shown in a partially sectional view as in FIG. 1. The insulating jacket section 5.2 of the conductor assembly 1 is disposed inside the enclosure 19. The sleeve 7 protrudes from the enclosure opening 19.1. The seal 21 extends annularly around the sleeve 7, electrically connecting the sleeve 7 conductively to the enclosure 19 and sealing the enclosure opening 19.1. The sleeve 7 is made of a graphite-containing material, for example. The conductor 3 is connected or connectable to a current path of the electrical equipment (for example, if the electrical equipment is an electrical machine, the conductor 3 is connected to a winding of the machine; if the electrical equipment is an electrical switching device, the conductor 3 is connected e.g. to a switching contact of the switching device). The sleeve 7 and the enclosure 19 are connected to ground potential, for example.

Figure 3:
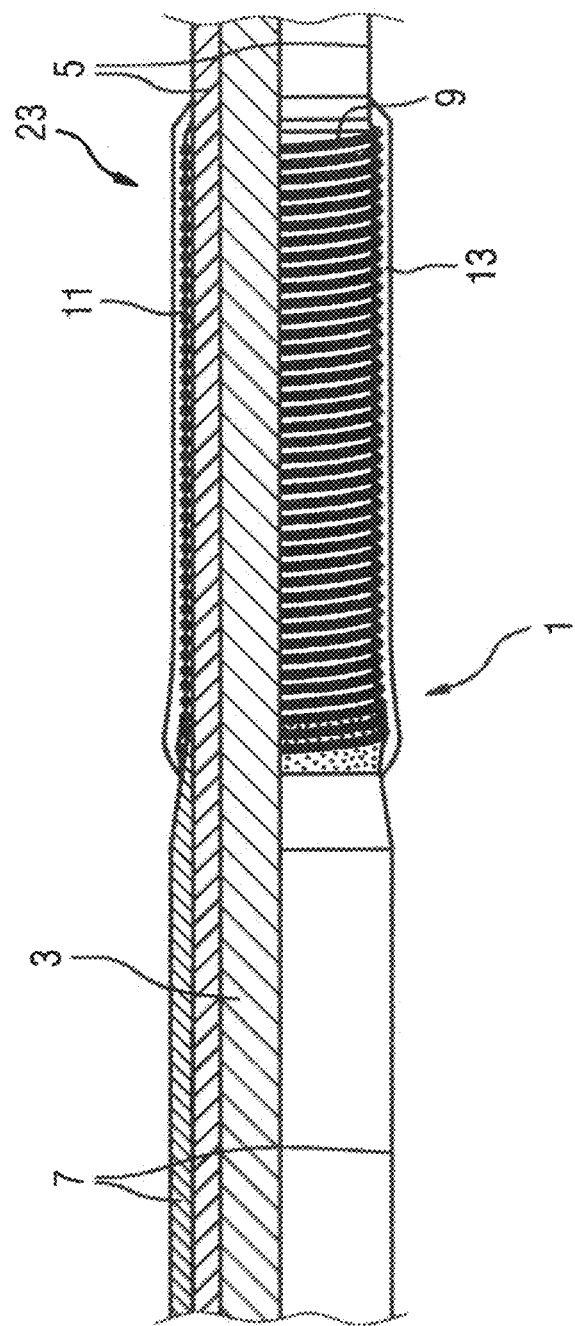

Similarly to FIG. 1, FIG. 3 shows a partially sectional view of an exemplary embodiment of a cable 23 according to the invention. The cable 23 comprises a conductor assembly 1, implemented as in FIG. 1, which forms a first end of the cable 23, wherein the insulating jacket 5 extends around the conductor 3 to a second end (not shown) of the cable 23. The second cable end can be of the same design as the first cable end.

The exemplary embodiments of conductor assemblies 1 shown in FIGS. 1 to 3 can be modified in a variety of ways. In particular, the helical winding of the yarn 9 can have locally different pitches in order to vary the electrical resistance of the winding along its course and to adapt it to suit the field control requirements. In addition, instead of a protective layer 13, a protective wrapper can be provided which covers the yarn 9 and the resin layer 11. Further exemplary embodiments of a conductor assembly 1 according to the invention do not have a resin layer 11 and/or a protective layer 13 at all. In other exemplary embodiments, the yarn 9 is not electrically connected to the sleeve 7, but is only capacitively coupled to the sleeve 7.

Although the invention has been illustrated and described in detail by preferred exemplary embodiments, the invention is not limited by the examples disclosed and other variations will be apparent to persons skilled in the art without departing from the scope of protection sought for the invention.

The invention claimed is:

1. A conductor assembly, comprising:
an electrical conductor:
an electrically insulating jacket disposed around a conductor section of the electrical conductor:
an electrically conductive sleeve disposed around a first insulating jacket section of the Insulating jacket; and
an electrically conductive yarn for realizing an electric field control, said electrically conductive yarn being wound around a second insulating jacket section of the electrically insulating jacket in adjacent relation to the first insulating jacket section,
wherein the electrically conductive yarn is made of a polyamide fiber sheathed with an electrically conductive carbon-containing material.

2. The conductor assembly of claim 1, wherein the electrically conductive yarn includes a yarn end section which is bonded to a sleeve end section of the sleeve.

3. The conductor assembly of claim 2, wherein the yarn end section is adhesively bonded to the sleeve end section.

4. The conductor assembly of claim 1, wherein the electrically conductive yarn is helically wound around the second insulating jacket section.

5. The conductor assembly of claim 4, wherein a helical winding of the electrically conductive yarn has different pitches.

6. The conductor assembly of claim 1, wherein the electrically conductive yarn has a specific electrical conductivity which is lower than a specific electrical conductivity of the sleeve.

7. The conductor assembly of claim 1, wherein the electrically conductive yarn has an electrical resistance in the range between 1 MΩ/m and 100 MΩ/m.

8. The conductor assembly of claim 1, further comprising a protective layer or protective wrapper placed in surrounding relation to the electrically conductive yarn.

9. The conductor assembly of claim 1, wherein the electrically conductive yarn is fixed to the second insulating jacket section by a curing or curable resin.

10. A cable, comprising a conductor assembly as set forth in claim 1.

11. A conductor assembly, comprising:
an electrical conductor;
an electrically insulating jacket disposed around a conductor section of the electrical conductor:
an electrically conductive sleeve disposed around a first insulating jacket section of the insulating jacket; and
an electrically conductive yarn for realizing an electric field control, said electrically conductive yarn being wound around a second insulating jacket section of the electrically insulating jacket in adjacent relation to the first insulating jacket section,
wherein the electrically conductive yarn is made of a fiber blend comprising a polyamide fiber and an electrically conductive carbon fiber.

12. A cable, comprising a conductor assembly as set forth in claim 11.

13. A method for manufacturing a conductor assembly, said method comprising:
disposing an electrically insulating jacket around a conductor section of an electrical conductor;
applying a curing or curable resin to an insulating jacket section of the electrically insulating jacket to fix an electrically conductive yarn made of a polyamide fiber sheathed with an electrically conductive carbon-containing material to the Insulating jacket section; and
winding the electrically conductive yarn around the insulating jacket section on the curing or curable resin before the resin has completely cured.

14. The method of claim 13, further comprising:
disposing an electrically conductive sleeve around another insulating jacket section of the electrically insulating jacket in adjacent relation to the insulating jacket section; and
bonding a yarn end section of the electrically conductive yarn to a sleeve end section of the electrically conductive sleeve.

15. The method of claim 13, wherein the electrically conductive yarn is helically wound around the insulating jacket section.

16. The method of claim 15, wherein a helical winding of the electrically conductive yarn has different pitches.

17. The method of claim 13, further comprising placing a protective layer or protective wrapper in surrounding relation to the electrically conductive yarn.

18. The method of claim 13, wherein the electrically conductive yarn is fixed to the insulating jacket section by a curing or curable resin.

19. An electrical bushing through an enclosure opening of an enclosure of an item of electrical equipment, said bushing comprising:
- a conductor assembly comprising an electrical conductor, an electrically insulating jacket disposed around a conductor section of the electrical conductor, an electrically conductive sleeve disposed around a first insulating jacket section of the insulating jacket, and an electrically conductive yarn for realizing an electric field control, said electrically conductive yarn being made of a polyamide fiber sheathed with an electrically conductive carbon-containing material and wound around a second insulating jacket section of the electrically insulating jacket in adjacent relation to the first insulating jacket section,
- wherein the electrically conductive sleeve is electrically connected to the enclosure and fed through the enclosure opening together with the electrical conductor and the first insulating jacket section of the electrically insulating jacket.

20. A method for manufacturing a conductor assembly, said method comprising:
- disposing an electrically insulating jacket around a conductor section of an electrical conductor;
- applying a curing or curable resin to an insulating jacket section of the electrically insulating jacket to fix an electrically conductive yarn made of a fiber blend comprising a polyamide fiber and an electrically conductive carbon fiber to the insulating jacket section; and
- winding the electrically conductive yarn around the insulating jacket section on the curing or curable resin before the resin has completely cured.

21. An electrical bushing through an enclosure opening of an enclosure of an item of electrical equipment, said bushing comprising:
- a conductor assembly comprising an electrical conductor, an electrically insulating jacket disposed around a conductor section of the electrical conductor, an electrically conductive sleeve disposed around a first insulating jacket section of the insulating jacket, and an electrically conductive yarn for, realizing an electric field control, said electrically conductive yarn being made of a fiber blend comprising a polyamide fiber and an electrically conductive carbon fiber and wound around a second insulating jacket section of the electrically insulating jacket in adjacent relation to the first insulating jacket section,
- wherein the electrically conductive sleeve is electrically connected to the enclosure and fed through the enclosure opening together with the electrical conductor and the first insulating jacket section of the electrically insulating jacket.

* * * * *